US012579977B2

(12) United States Patent
Chao

(10) Patent No.: US 12,579,977 B2
(45) Date of Patent: Mar. 17, 2026

(54) WATERMARK-BASED AUDIO PROCESSING METHOD AND AN AUDIO PLAYER UTILIZING THE SAME

(71) Applicant: Realtek Semiconductor Corp., HsinChu (TW)

(72) Inventor: Ying-Ying Chao, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 177 days.

(21) Appl. No.: 18/414,474

(22) Filed: Jan. 17, 2024

(65) Prior Publication Data

US 2024/0282302 A1     Aug. 22, 2024

(30) Foreign Application Priority Data

Feb. 21, 2023    (TW) .................................. 112106274

(51) Int. Cl.
*G10L 15/22*          (2006.01)
*G10L 15/04*          (2013.01)
(Continued)

(52) U.S. Cl.
CPC .............. *G10L 15/22* (2013.01); *G10L 15/04* (2013.01); *G10L 15/08* (2013.01); *G10L 19/018* (2013.01);
(Continued)

(58) Field of Classification Search
CPC ......... G10L 15/22; G10L 15/04; G10L 15/08; G10L 19/018; G10L 25/21; G10L 25/51;
(Continued)

(56) References Cited

U.S. PATENT DOCUMENTS

| | | | | |
|---|---|---|---|---|
| 7,020,285 B1 * | 3/2006 | Kirovski | ............... | G10L 19/018 |
| | | | | 382/250 |
| 9,912,986 B2 * | 3/2018 | Eyer | .................. | H04N 21/8358 |

(Continued)

FOREIGN PATENT DOCUMENTS

| | | | | | |
|---|---|---|---|---|---|
| CA | 2791046 A1 * | 9/2011 | ........... | G10L 19/018 |
| CN | 101263552 A * | 9/2008 | ........... | G10L 19/018 |

(Continued)

OTHER PUBLICATIONS

Tai ,Audio watermarking algorithm is first to solve "second-screen problem" in real time ,https://www.amazon.science/blog/audio-watermarking-algorithm-is-first-to-solve-second-screen-problem-in-real-time ,Mar. 28, 2019.

(Continued)

*Primary Examiner* — Mohammad K Islam
(74) *Attorney, Agent, or Firm* — Winston Hsu

(57) ABSTRACT

A watermark-based audio processing method for use in the audio player including a receiver, an analog-to-digital converter, a processor, a digital-to-analog converter and a transmitter includes: the receiver receiving an audio input signal, the analog-to-digital converter converting the audio input signal into a digital input signal including a keyword, the processor detecting an energy of the digital input signal, if the energy exceeds a threshold, the processor determining whether a watermark is included in the digital input signal, if not, the processor embedding the watermark into a predefined digital audio signal to generate a digital output signal, then the digital-to-analog converter converting the digital output signal into an audio output signal, and finally, the transmitter outputting the audio output signal for playback.

18 Claims, 6 Drawing Sheets

(51) Int. Cl.

| | | |
|---|---|---|
| *G10L 15/08* | (2006.01) | |
| *G10L 19/018* | (2013.01) | |
| *G10L 25/21* | (2013.01) | |
| *G10L 25/51* | (2013.01) | |
| *H03M 1/12* | (2006.01) | |

(52) U.S. Cl.
CPC .............. *G10L 25/21* (2013.01); *G10L 25/51* (2013.01); *H03M 1/12* (2013.01); *G10L 2015/088* (2013.01); *G10L 2015/223* (2013.01)

(58) Field of Classification Search
CPC ........ G10L 2015/088; G10L 2015/223; H03M 1/12
See application file for complete search history.

(56) References Cited

U.S. PATENT DOCUMENTS

| | | | | |
|---|---|---|---|---|
| 12,256,121 | B2 * | 3/2025 | Lynch .................. | G06F 21/105 |
| 2004/0059918 | A1 * | 3/2004 | Xu ....................... | G10L 19/018 |
| | | | | 704/E19.009 |
| 2007/0300066 | A1 * | 12/2007 | Srinivasan ........... | G06T 1/0021 |
| | | | | 704/E19.009 |
| 2011/0119065 | A1 * | 5/2011 | Pietrusko ............. | G11B 27/036 |
| | | | | 704/500 |
| 2012/0239407 | A1 * | 9/2012 | Lynch .................. | G06F 16/683 |
| | | | | 704/500 |
| 2013/0331971 | A1 * | 12/2013 | Bida ..................... | G10L 19/018 |
| | | | | 700/94 |
| 2014/0236592 | A1 * | 8/2014 | Neuhauser ............ | H04H 60/58 |
| | | | | 704/231 |
| 2015/0039320 | A1 * | 2/2015 | Neuhauser ........... | G10L 19/018 |
| | | | | 704/500 |
| 2015/0221316 | A1 * | 8/2015 | Mufti ................... | G10L 19/018 |
| | | | | 700/94 |
| 2017/0148126 | A1 * | 5/2017 | Srinivasan ........... | G06T 1/0071 |
| 2018/0336657 | A1 * | 11/2018 | Nielsen ................ | G10L 19/018 |
| 2019/0007729 | A1 * | 1/2019 | Heffernan ............. | H04H 60/43 |
| 2019/0295560 | A1 * | 9/2019 | Christian ............. | G10L 19/018 |
| 2020/0183973 | A1 * | 6/2020 | Balcers ................. | G10L 19/018 |
| 2020/0202874 | A1 * | 6/2020 | Kuznetsov ........... | G10L 19/018 |
| 2020/0221169 | A1 * | 7/2020 | Heffernan ............. | H04H 60/37 |
| 2020/0312340 | A1 * | 10/2020 | Hudson ................ | G06F 16/683 |
| 2021/0233204 | A1 * | 7/2021 | Alattar ................. | G10L 19/018 |
| 2021/0304776 | A1 * | 9/2021 | Li ......................... | G10L 19/018 |
| 2023/0019841 | A1 * | 1/2023 | Tu ........................ | G10L 19/018 |
| 2023/0206377 | A1 * | 6/2023 | Kuznetsov ........... | G10L 19/018 |
| | | | | 382/232 |
| 2024/0404535 | A1 * | 12/2024 | Gish ..................... | G10L 19/018 |

FOREIGN PATENT DOCUMENTS

| | | | | | |
|---|---|---|---|---|---|
| CN | 108648761 | A | * | 10/2018 | .......... G10L 19/032 |
| CN | 105976823 | B | * | 6/2019 | .......... G10L 19/018 |
| CN | 111091841 | A | * | 5/2020 | .......... G06V 40/172 |
| CN | 116312510 | A | * | 6/2023 | ............ G10L 15/22 |
| EP | 3133597 | A1 | * | 2/2017 | .............. H04K 1/10 |
| TW | 1337501 | | | 2/2011 | |
| TW | 201232323 | A1 | | 8/2012 | |
| WO | WO-0249363 | A1 | * | 6/2002 | .......... G10L 19/018 |
| WO | WO-2010081931 | A1 | * | 7/2010 | ........ H04N 1/32149 |
| WO | WO-2023004159 | A1 | * | 1/2023 | ............ G10L 25/57 |

OTHER PUBLICATIONS

Tai , Conference Paper : Audio Watermarking over the Air with Modulated Self-correlation ,ICASSP 2019—2019 IEEE International Conference on Acoustics, Speech and Signal Processing (ICASSP) ,May 2019.
Djaziri-Larbi ,Research : Watermark driven Acoustic Echo Cancellation ,Mar. 26, 2020.
Khan ,Paper : A New Audio Watermarking Method Based on Discrete Cosine Transform With a Gray Image ,IJCSIT 2012 ,Aug. 2012.
Pattanshetti ,Paper : A Review of an Digital Audio Watermarking using DCT Technique ,IJERT 2014 , Jul. 2014.
Lien ,Report : Echo Cancellation in Large-Scale VoIP Conferencing ,2009.

* cited by examiner

S310

WATERMARK-BASED AUDIO PROCESSING METHOD AND AN AUDIO PLAYER UTILIZING THE SAME

BACKGROUND OF THE INVENTION

1. Field of the Invention

The present invention relates to audio signal processing, and in particular, to a watermark-based audio processing method and an audio player.

2. Description of the Prior Art

A set-top box (STB) is a network terminal device that realizes functions such as video on demand, live TV, web browsing, watching movies or playing TV games on a traditional TV. The STB may perform various operations via voice commands. However, the conventional set-top boxes simply display the voice command on the TV screen for the user to confirm upon receiving the voice command, being not intuitive to use and bringing inconvenience to the user.

SUMMARY OF THE INVENTION

According to an embodiment of the invention, an audio player includes a receiver, an analog-to-digital converter, a processor, a digital-to-analog converter, and a transmitter. A watermark-based audio processing method suitable for the audio player includes the receiver receiving an audio input signal, the analog-to-digital converter converting the audio input signal from analog to digital to generate a digital input signal, the processor detecting an energy of the digital input signal. The method further includes if the energy exceeds a threshold, the processor determining whether a watermark is included in the digital input signal, if no watermark is included in the digital input signal, the processor embedding the watermark into a preset digital audio signal to generate a digital output signal, the digital-to-analog converter converting the digital output signal from digital to analog to generate an audio output signal, and the transmitter outputting the audio output signal for playback.

According to another embodiment of the invention, an audio player includes a receiver, an analog-to-digital converter, a processor, a digital-to-analog converter, and a transmitter. The receiver is used to receive an audio input signal. The analog-to-digital converter is coupled to the receiver, and is used to convert the audio input signal from analog to digital to generate a digital input signal. The processor is coupled to the analog-to-digital converter, and is used to detect an energy of the digital input signal, determine whether the digital input signal contains a watermark if the energy exceeds a threshold, and embed the watermark into a preset digital audio signal to generate a digital output signal if no watermark is included in the digital input signal. The digital-to-analog converter is coupled to the processor, and is used to convert the digital output signal from digital to analog to generate an audio output signal. The transmitter is coupled to the digital-to-analog converter, and is used to output the audio output signal for playback.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
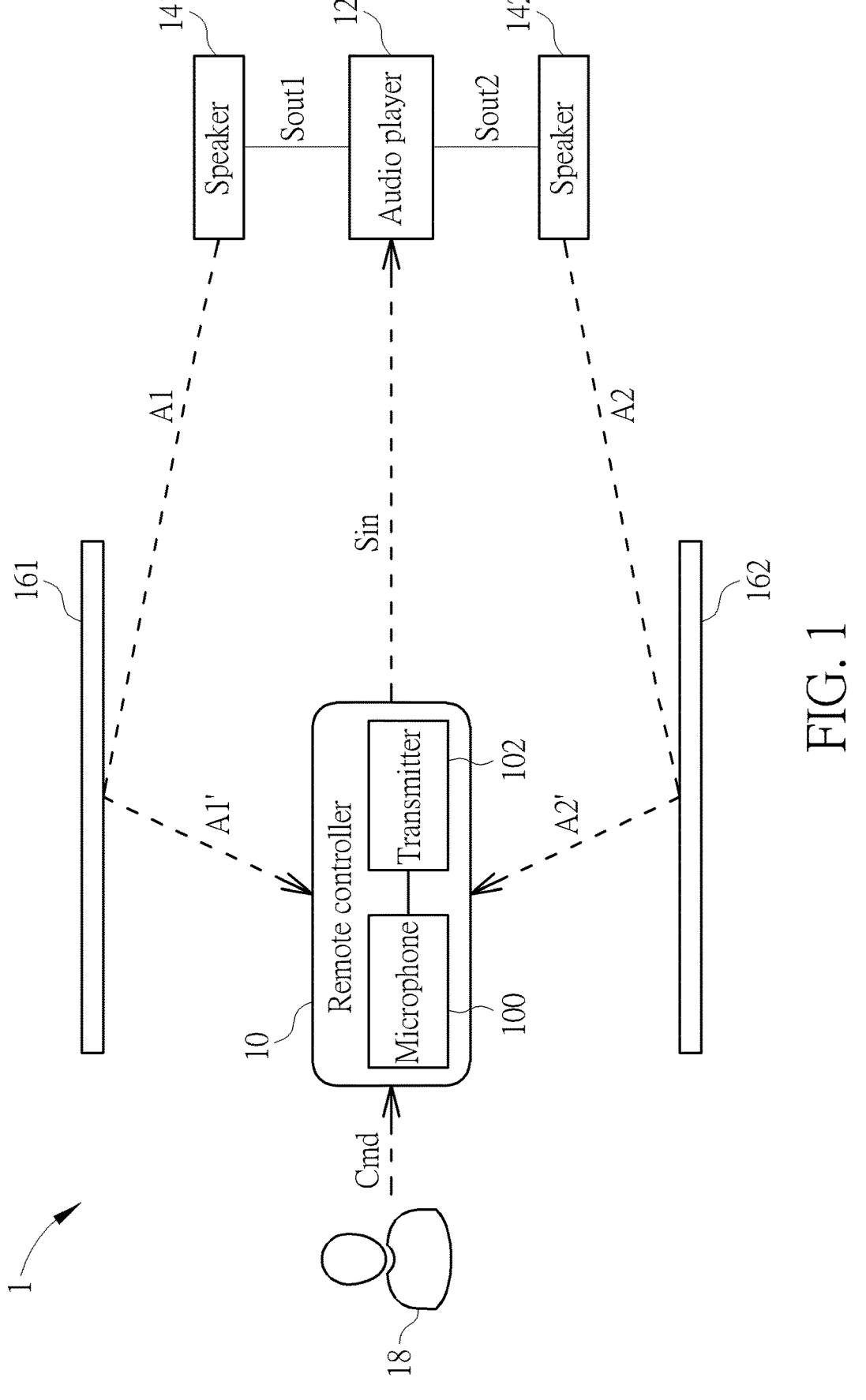
FIG. 1 is a block diagram of a watermark-based audio system according to an embodiment of the invention.

FIG. 1 is a block diagram of a watermark-based audio system 1 according to an embodiment of the invention. The audio system 1 may receive a voice command from a user 18 and execute a function corresponding to the voice command. In addition, the audio system 1 may embed at least one watermark into a preset digital audio signal to generate an audio output signal, the preset digital audio signal conforming to a service language setting in the audio system 1, and then the audio system 1 may play back the audio output signal having the watermark embedded for the user 18 to listen and confirm, thereby enhancing system accessibility and usability. If the voice command is incorrect, the user 18 may say the keyword "cancel the command" or other equivalent keywords to cancel the last voice command in the audio system 1. Each watermark may contain a set of watermark bits. Since the playback of the audio output signal contains at least one watermark, the audio system 1 may determine that the audio output is not from the user 18 and will not repeatedly execute the voice command.

The audio system 1 may include a remote controller 10, an audio player 12, and speakers 141 and 142. The remote controller 10 may be coupled to the audio player 12 via a wireless connection, and the audio player 12 may be coupled to the speakers 141 and 142 via a wired or wireless connection. The wireless connection may be Bluetooth, Wi-Fi, or others. The wired connection may be Universal Serial Bus (USB) or others. In some embodiments, the audio player 12 may be integrated in a set-top box (STB) or a smart speaker controller. If the audio player 12 is integrated in the set-top box, the set-top box may further receive voice commands from the user 18 via the audio player 12 to control various operations of a television. In some embodiments, the speakers 141 and 142 may be arranged separately from the audio player 12. In other embodiments, the speakers 141 and 142 may be integrated into the audio player 12. In some embodiments, the audio system 1 may be installed in an indoor environment including obstructions 161 and 162. The obstructions 161 and 162 may be walls, ceilings, tables and chairs or others. If a sound wave collides with the obstructions 161 and/or 162, the sound wave will be attenuated.

The remote control 10 may include a microphone 100 and a transmitter 102 coupled to each other. The microphone 100 may receive the voice command Cmd from the user 18. The voice command Cmd may contain a keyword such as "play music", "adjust volume", "broadcast weather", "set an alarm clock", and so on. The transmitter 102 may generate and transmit an audio input signal Sin to the audio player 12 according to the voice command Cmd, and the audio input signal Sin may include the keyword. The audio input signal Sin may be a pulse-code modulation (PCM) signal, and may be a time-domain signal. The audio player 12 may execute a function corresponding to the keyword, and embed P sets of watermark bits of P watermarks into a preset digital audio signal to generate audio output signals Sout1 and Sout2, P being a positive integer, e.g., P is equal to 15. The P sets of watermark bits may be identical, and may be generated according to the American standard code for information interchange (ASCII) code of a preset text string. For example, the preset text string may be "Realtek", and each set of watermark bits may be generated according to the ASCII code of "Realtek" (e.g., "0010 0101 0001 1100 0100 0101 1011"), including 28 bits in total. The preset digital audio signal may correspond to the keyword, and may be a built-in digital audio signal conforming to the service language setting in the audio system 1. For example, the service language setting may be English, and the preset digital audio signal may be a built-in digital audio signal corresponding to the keyword "play music" in English. The audio output signals Sout1 and Sout2 may be different stereo signals or identical mono signals. In addition, both the audio output signals Sout1 and Sout2 may be pulse code modulation signals, and may be time-domain signals. The speakers 141 and 142 may generate playback sound waves A1 and A2 according to the audio output signals Sout1 and Sout2, respectively, and the playback sound waves A1 and A2 may be transmitted over the air and bounced by obstructions 161 and 162 to generate attenuated playback sound waves A1' and A2'. The microphone 100 may further receive the attenuated playback sound waves A1' and A2', and the transmitter 102 may further generate and transmit the audio input signal Sin to the audio player 12 according to the attenuated playback sound waves A1' and/or A2'. If the audio player 12 detects that the audio input signal Sin contains at least one set of watermark bits (e.g., "0010 0101 0001 1100 0100 0101 1011"), the audio output signals Sout1 and Sout2 will not be generated and the function corresponding to the keyword will not be executed again.

Figure 2:
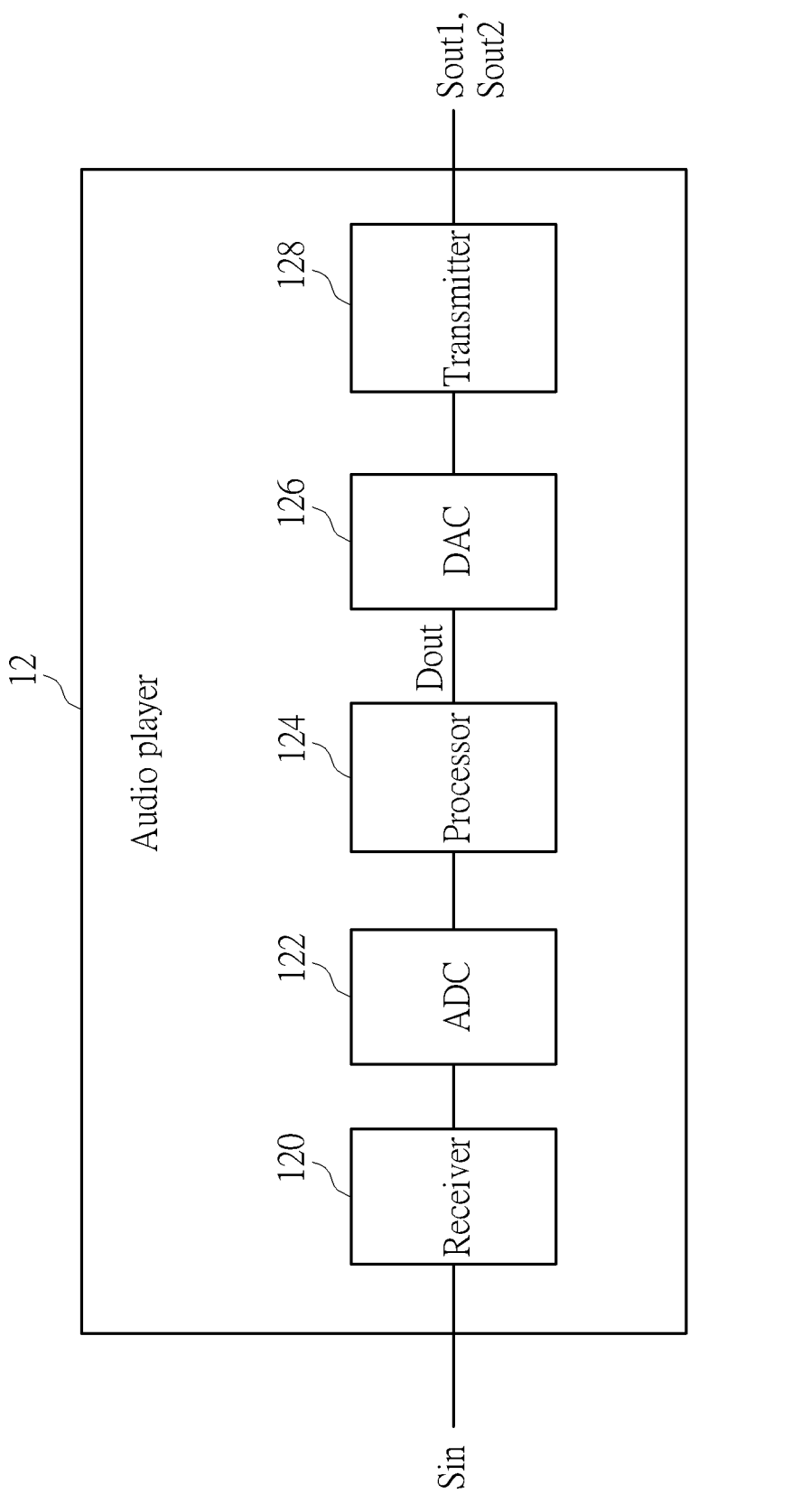
FIG. 2 is a block diagram of the audio player in FIG. 1.

FIG. 2 is a block diagram of the audio player 12 in FIG. 1. The audio player 12 may include a receiver 120, an analog-to-digital converter (ADC) 122, a processor 124, a digital-to-analog converter (DAC) 126, and a transmitter 128 coupled in sequence. The receiver 120 may receive the audio input signal Sin, the analog-to-digital converter 122 may convert the audio input signal Sin from analog to digital according to a preset sampling rate, and the processor 124 may segment the output signal of the analog-to-digital converter 122 to generate a digital input signal. For example, if the preset sampling rate is 48 kHz, the analog-to-digital converter 121 may sample the audio input signal Sin to generate 48 k digital data per second to provide the digitized audio input signal. The processor 124 may segment the digitized audio input signal according to a preset window size to generate the digital input signal, and detect the energy of the digital input signal, detect the watermark in the digital input signal or embed the watermark into the preset digital audio signal, and execute the corresponding function according to the keyword. In some embodiments, the preset window size may be fixed in length, e.g., 3 seconds. In other embodiments, the processor 124 may set the preset window size according to the length of the voice command Cmd. In some embodiments, the processor 124 may generate a digital output signal Dout having the watermark embedded, the digital-to-analog converter 126 may convert the digital output signal Dout from digital to analog to generate an analog output signal, and the transmitter 128 may generate audio output signals Sout1 and Sout2 according to the analog output signal, and respectively transmit the audio output signals Sout1 and Sout2 to the speakers 141 and 142 for playback. The user 18 may determine that the audio player 12 has correctly recognized the voice command Cmd by listening to the playback of the audio output signals Sout1 and Sout2.

Figure 3:
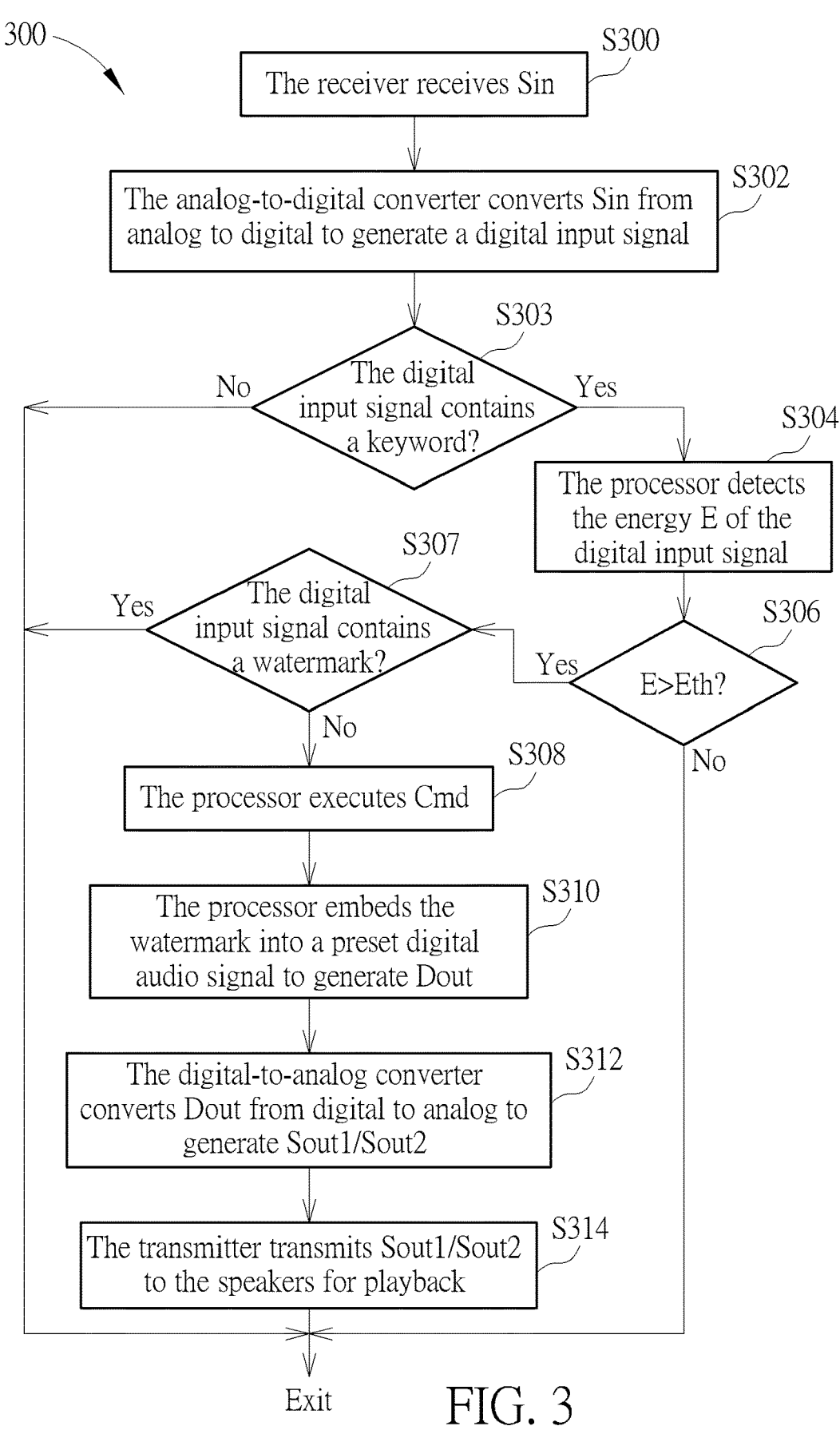
FIG. 3 is a flowchart of an audio processing method of the audio player in FIG. 1.

FIG. 3 is a flowchart of an audio processing method 30 of the audio player 12. The audio processing method 300 includes Steps S300 to S314, wherein Steps S300 to S303 are used to determine whether a digital input signal contains a keyword; if the digital input signal contains the keyword, proceed to Steps S304 and S306 to determine whether the energy of the digital input signal exceeds the threshold Eth; If the energy of the digital input signal exceeds the threshold Eth, proceed to Step S307 to determine whether the digital input signal contains a watermark; if the digital input signal does not contain a watermark, the digital input signal is the input voice of the user 18, and the method 300 proceeds to Steps S308 to S314 to play back the audio output signals Sout1 and Sout2 containing the watermark. Any reasonable step change or adjustment is within the scope of the present disclosure. Steps S300 to S314 are detailed as follows:

Step S300: The receiver 120 receives the audio input signal Sin;

Step S302: The analog-to-digital converter 122 converts the audio input signal Sin from analog to digital to generate a digital input signal;

Step S303: The processor 124 determines whether the digital input signal contains a keyword? If so, continue to Step S304; if not, terminate the method 300.

Step S304: The processor 124 detects the energy E of the digital input signal;

Step S306: The processor 124 determines whether the energy E exceeds the threshold Eth? If so, continue to step S307; if not, terminate the method 300.

Step S307: The processor 124 determines whether the digital input signal contains a watermark? If not, continue to Step S308; if so, terminate the method 300.

Step S308: The processor 124 executes the voice command Cmd;

Step S310: The processor 124 embeds the watermark into a preset digital audio signal to generate a digital output signal Dout;

Step S312: The digital-to-analog converter converts the digital output signal Dout from digital to analog to generate audio output signals Sout1/Sout2;

Step S314: The transmitter 128 transmits the audio output signals Sout1/Sout2 to the speakers 141/142 for playback; terminate the method 300.

In Step S300, the receiver 120 receives an audio input signal Sin from the remote controller 10. In Step S302, the analog-to-digital converter 122 samples the audio input signal Sin at a preset sampling rate (e.g., 48 kHz) to generate a digital input signal. In Step S306, if the energy E exceeds the threshold Eth, the digital input signal may be considered as being issued by the user 18 at a normal volume or from the playback sound waves A1' and/or A2' at a higher volume. If the energy E does not exceed the threshold Eth, the digital input signal may be considered as being generated from the playback sound waves A1' and/or A2' or by the user 18 at a lower volume. If the energy E does not exceed the threshold Eth, the digital input signal will not be processed. If the energy E exceeds the threshold Eth, then in Step 307, the processor 124 determines whether the digital input signal contains a watermark, and determines that digital input signal is a voice issued from the user 18 (no watermark) or a playback sound wave (including the watermark). In Steps S307 and S310, the watermark may be, for example, the ASCII code of "Realtek" (e.g., "0010 0101 0001 1100 0100

Figure 4:
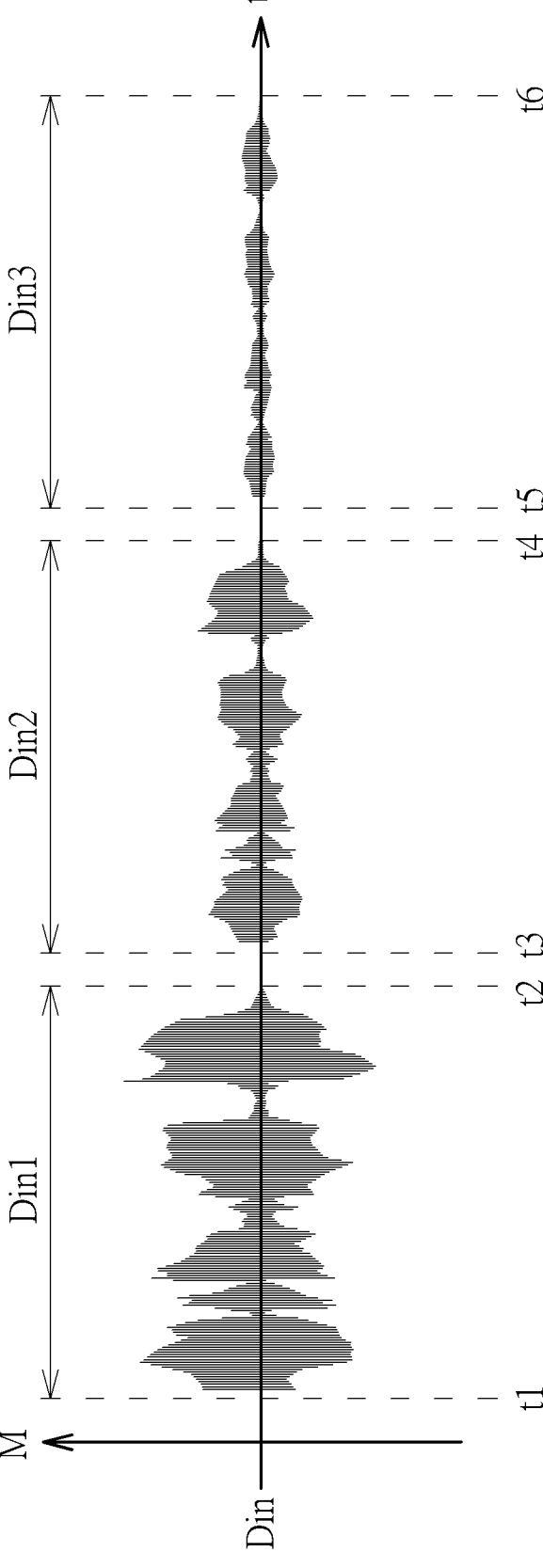
FIG. 4 is a schematic diagram of the audio input signal of the audio player in FIG. 1.

0101 1011"). The audio processing method 300 is explained with reference to FIGS. 1, 2 and 4. FIG. 4 is a schematic diagram of the digital input signal, wherein the horizontal axis represents the time t, and the vertical axis represents the amplitude M.

For a first digital input signal Din1 between Time t1 and Time t2, the processor 124 determines that the first digital input signal Din1 contains a keyword (such as "increase the volume") (Step S303), and thus detecting the energy E of the first digital input signal Din1 (Step S304). The time interval between Time t1 and Time t2 may be 3 seconds, and therefore, the first digital input signal Din1 includes 144 k (=48 k*3) samples. The larger the area of the first audio input signal Din1 is, the larger the energy E will be, indicating that the volume is higher.

Next, the processor 124 compares the energy E of the first digital input signal Din1 to the threshold Eth (Step S306). Since the energy E of the first digital input signal Din1 exceeds the threshold Eth, the processor 124 continues to determine whether the first digital input signal Din1 contains the watermark (Step S307). The process for determining whether the digital input signal contains a watermark may be shown in FIG. 6, and will be explained in detail in subsequent paragraphs. Since the processor 124 determines that the first digital input signal Din1 does not contain the watermark, the method 300 proceeds to Step S308.

Figure 5:
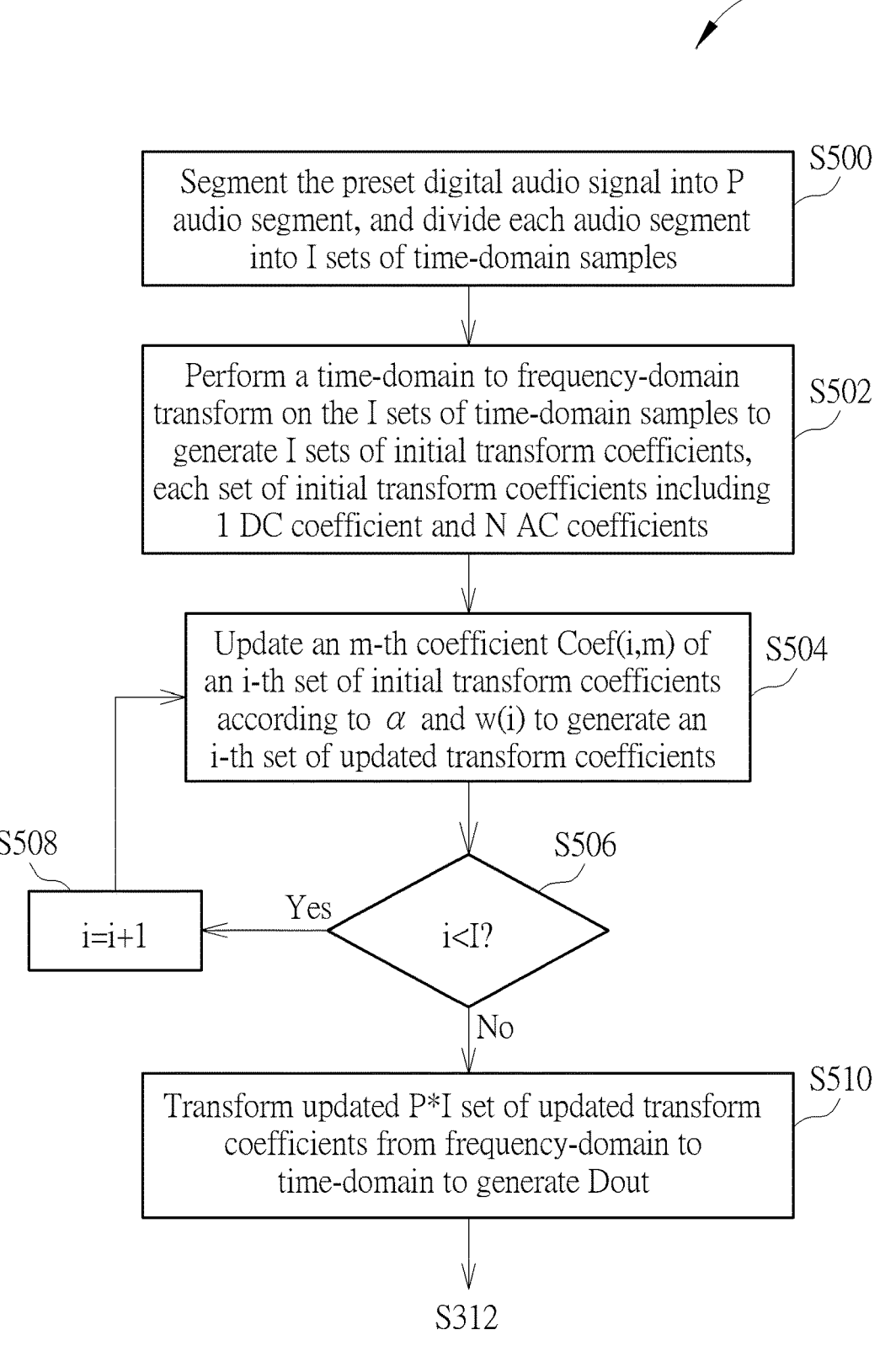
FIG. 5 is a flowchart of the watermark embedding step in FIG. 3.

In Step S308, the processor 124 increases the playback volume according to the keyword "increase the volume", so as to execute the voice command Cmd. In Step S310, since the first digital input signal Din1 does not contain the watermark, the processor 124 embeds the watermark into a preset digital audio signal (e.g., a built-in digital audio signal of "increase volume" in English). In some embodiments, the processor 124 may embed the watermark by embedding P sets (e.g., 15 sets) of watermark bits (e.g., "0010 0101 0001 1100 0100 0101 1011") into the preset voice digital signal to generate the first set of digital output Signal Dout. FIG. 5 shows an approach of embedding the watermark, explanation therefor will be discussed in detail in the subsequent paragraphs.

In Step S312, the digital-to-analog converter 126 converts the first set of digital output signals Dout into the audio output signals Sout1 and Sout2. In Step S314, the transmitter 128 transmits the audio output signals Sout1 and Sout2 to the speakers 141 and 142 for playback, and the method 300 is terminated.

For a second digital input signal Din2 between Time t3 and Time t4, the processor 124 determines that the second digital input signal Din2 contains a keyword (such as "increase volume") (Step S303), and thus detecting the energy E of the second digital input signal (Step S304). The time interval between Time t3 and Time t4 may be 3 seconds, thus the second digital input signal Din2 includes 144 k (=48 k*3) samples.

Next, the processor 124 compares the energy E of the second digital input signal Din2 to the threshold Eth (Step S306). Since the energy E of the second digital input signal Din2 exceeds the threshold Eth, the processor 124 continues to determine whether the second digital input signal Din2 contains the watermark (Step S307). Since the processor 124 determines that the second digital input signal Din2 contains the watermark, the second digital input signal Din2 may be generated by the playback sound waves A1' and/or A2' with a relatively high volume, and thus the method 300 is terminated.

For a third digital input signal Din3 between Time t5 and Time t6, the processor 124 determines that the third digital input signal Din3 contains a keyword (such as "increase the volume") (Step S303), so the third digital input is detected The energy E of the signal Din3 (Step S304). The time interval between Time t5 and Time t6 may be 3 seconds, thus the third digital input signal Din3 includes 144 k (=48 k*3) samples.

Next, the processor 124 compares the energy E of the third digital input signal Din3 to the threshold Eth (Step S306). Since the energy E of the third digital input signal Din3 does not exceed the threshold Eth, the method 300 is terminated.

FIG. 5 is a flowchart of the watermark embedding process in Step S310 in FIG. 3. Step S310 includes Steps S500 to S510 for embedding P sets of watermark bits into the preset digital audio signal conforming to the service language setting in the audio system 1, so as to generate a set of digital output signals Dout. Any reasonable step change or adjustment is within the scope of the present disclosure. Steps S500 to S510 are detailed as follows:

Step S500: Segment the preset digital audio signal into P audio segment, and divide each audio segment into I sets of time-domain samples;

Step S502: Perform a time-domain to frequency-domain transform on the I sets of time-domain samples to generate I sets of initial transform coefficients, each set of initial transform coefficients including 1 DC coefficient and N AC coefficients;

Step S504: Update an m-th coefficient Coef(i,m) of an i-th set of initial transform coefficients according to the embedding coefficient $\alpha$ and an i-th bit w(i) of the set of watermark bits to generate an i-th set of updated transform coefficients;

Step S506: Determine whether i is less than I? If so, proceed to Step S508; if not, proceed to Step S510;

Step S508: Update i to i+1;

Step S510: Transform updated P*I set of updated transform coefficients from frequency-domain to time-domain to generate a set of digital output signals Dout; Proceed to Step S312.

In Step S500, the processor 124 first segments the preset digital audio signal (e.g., the built-in digital audio signal of "increase the volume") into P audio segments (e.g., P=15), each audio segment being to be embedded with a set of watermark bits (e.g., "0010 0101 0001 1100 0100 0101 1011"), and then divide each audio segment into I sets (such as I=28) of time-domain samples, each set of time-domain samples being to be embedded with a watermark bit. According to the preceding paragraphs, each digital input signal may contain 144 k samples, and thus, each audio segment may contain 9600 (=144000/15) samples, and each set of time-domain samples may contain 342 (=9600/28) samples.

In Step S502, starting from the first audio segment, the processor 124 converts 28 sets of time-domain samples from time-domain to frequency-domain according to a discrete cosine transform (DCT) or other types of discrete Fourier transform to generate 28 sets of initial transform coefficients, each set of initial transform coefficients being to be embedded with a watermark bit. Each set of initial transform coefficients includes 1 DC coefficient Coef(i,0) and N (for example, 31) AC coefficients Coef(i,n), where the DC coefficient Coef(i,0) represents the DC coefficient of the i-th set of initial transform coefficients, and the AC coefficient Coef(i,n) represents the nth AC coefficient of the i-th set of initial transform coefficients, i and n are positive integers, $i \leq I$, $n < N$. In some embodiments, the processor 124 may record the coefficients Coef(i,0) to Coef(i,N) of the i-th set of initial transform coefficients in the local memory.

In Step S504, the processor 124 updates an m-th AC coefficient Coef(i,m) of the i-th set of initial transform coefficients to generate an m-th updated AC coefficient Coef(i,m) of an i-th set of updated transform coefficients as expressed in Equation Eq(1), i≤I, m<N:

$$Coef'(i, m) = Coef(i, m) * (1 + \alpha * w(i)) \qquad \text{Eq (1)}$$

For example, the embedding coefficient α may be 1, if i=1, the first bit in the set of watermark bits ("0010 0101 0001 1100 0100 0101 1011") is "0", and thus the processor 124 computes the coefficient (1+a*w(i)) to be 1 (=1+1*0), and generates an updated AC coefficient Coef(i,m) equal to the AC coefficient Coef(i,m). The processor 124 may use the coefficient (1+α*w(i)) to generate one or more updated AC coefficients according to Equation Eq(1). In some embodiments, m is 1, and the AC coefficient may also be referred to as the fundamental frequency coefficient, and the processor 124 may use the coefficient (1+α*w(i)) to generate the update the AC coefficient Coef(i, 1) of the i-th set of updated transform coefficients according to Equation Eq(1). In some other embodiments, m is 1 to 3, and the processor 124 may use the coefficients (1+α*w(i)) to generate the updated the AC coefficients Coef(i,1) to Coef(i,3) according to Equation Eq(1). In general, if the embedding coefficient α increases, the change of the watermark bit w(i) with respect to the coefficient Coef(i,m) may increase accordingly, increasing the detectability of the watermark bit at the cost of distorting the sound perceivable by the user. Further, the sound distortion caused by updating the AC coefficient at a lower frequency is less, and the user is less likely to perceive the sound.

In Step S506, since i=1, the processor 124 determines that i is less than I (1<28), and thus in Step S510, i is set to 2 (=1+1). Next, the processor 124 repeats the loop of Steps S504 to S510 until i reaches 28, so as to update the I set of initial transform coefficients of the audio segment. In addition, the processor 124 repeats Steps S502 to S510 for the P audio segments to update the P*I set of initial transform coefficients of the P audio segments. In Step S512, the processor 124 converts the updated P*I set of initial transform coefficients from frequency-domain to time-domain according to an inverse discrete cosine transform (IDCT) or other types of inverse discrete Fourier transform to generate the set of digital output signal Dout. In some embodiments, the processor 124 may save the coefficients Coef(0,0) to Coef(I,N) in the local memory for subsequent uses.

Figure 6:
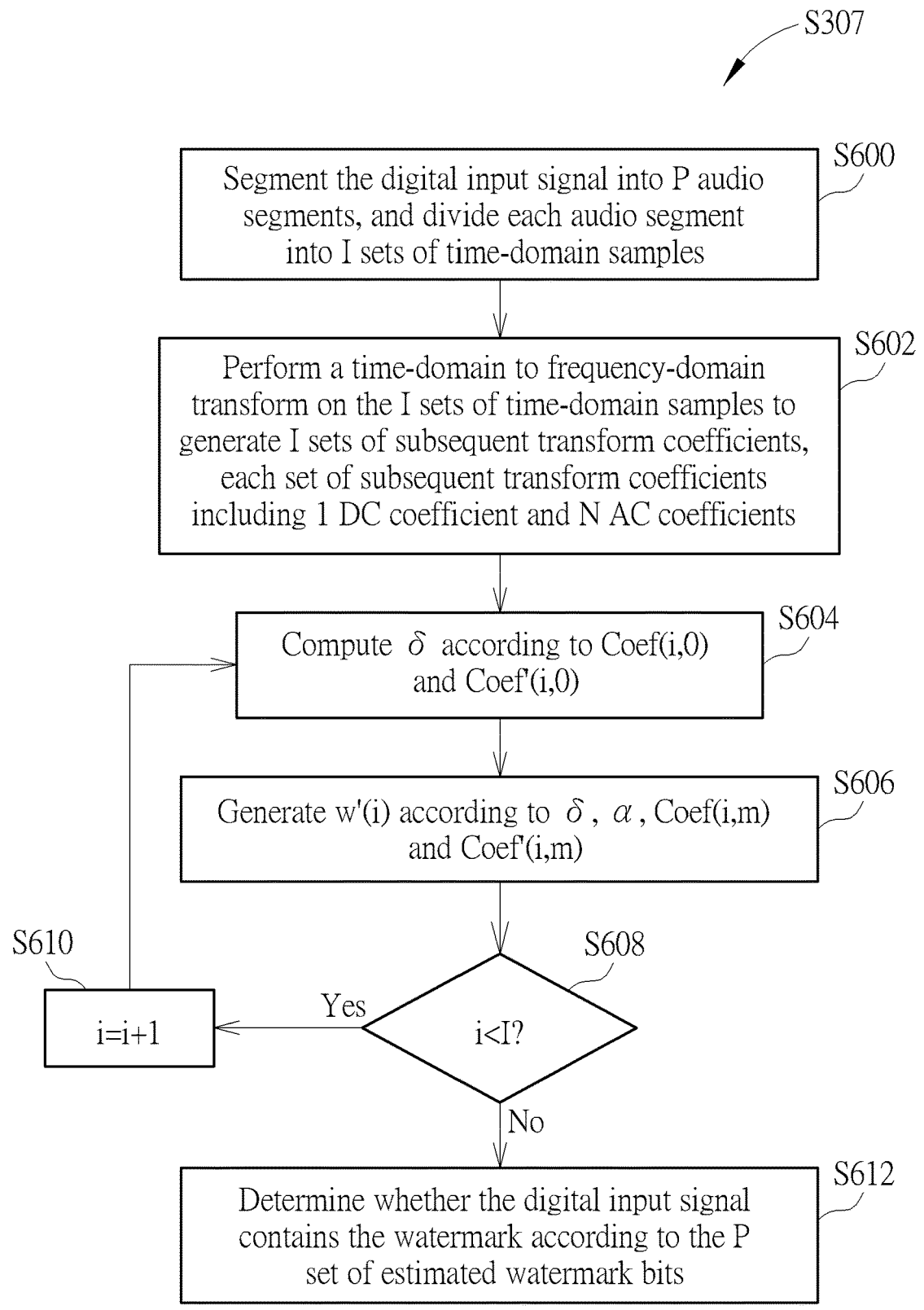
FIG. 6 is a flowchart of the watermark detection step in FIG. 3.

FIG. 6 is a flowchart of a watermark detection process in Step S307 in FIG. 3. Step S307 includes steps S600 to S612 for determining whether a segment of digital input signal contains the set of watermark bits. Any reasonable step change or adjustment is within the scope of the present disclosure. Steps S600 to S612 are detailed as follows:

Step S600: Segment the digital input signal into P audio segments, and divide each audio segment into I sets of time-domain samples;

Step S602: Perform a time-domain to frequency-domain transform on the I sets of time-domain samples to generate I sets of subsequent transform coefficients, each set of subsequent transform coefficients including 1 DC coefficient and N AC coefficients;

Step S604: Compute an attenuation coefficient δ according to the DC coefficient Coef (i,0) of the i-th set of the initial transform coefficients and the DC coefficient Coef (i,0) of an i-th set of subsequent transform coefficients;

Step S606: Generate an i-th estimated bit w'(i) of a set of estimated watermark bits according to the attenuation coefficient δ, the embedding coefficient α, the m-th AC coefficient Coef(i,m) of the i-th set of initial transform coefficients, and the m-th AC coefficient Coef(i,m) of the i-th set of subsequent transform coefficients;

Step S608: Determine whether i is less than I? If so, proceed to Step S610; if not, proceed to Step S612;

Step S610: Update i to i+1;

Step S612: Determine whether the digital input signal contains the watermark according to the P set of estimated watermark bits.

In Step S600, the processor 124 first segments the digital input signal into P audio segments (e.g., P=15), and then divides each audio segments into I sets of time-domain samples (e.g., I=28). According to the preceding paragraphs, each audio segment may include 9600 (=144000/15) samples, and each set of time-domain samples may include 342 (=9600/28) samples. In Step S602, starting from the first audio segment, the processor 124 converts 28 sets of time-domain samples from time-domain to frequency-domain according to the discrete cosine transform (DCT) or other types of discrete Fourier transform to generate 28 sets of subsequent transform coefficients, each set of subsequent transform coefficients having one DC coefficient Coef(i,0) and N (e.g., N=31) AC coefficients Coef(i,n), the DC coefficient Coef(i,0) representing the DC coefficient of an i-th set of subsequent transform coefficients, the AC coefficient Coef(i,n) representing the nth AC coefficient of the i-th set of subsequent transform coefficients, i and n being positive integers, i≤I, n<N. In some embodiments, the processor 124 may record the coefficients Coef (i,0) to Coef'(i,N) of the i-th set of subsequent transform coefficients in the local memory.

In Step S604, the processor 124 computes an attenuation coefficient δ of the i-th set of subsequent transform coefficients starting from i=1, the attenuation coefficient δ being related to the attenuation level of sound wave propagation. The processor 124 acquires the DC coefficient Coef(i,0) of the i-th set of initial transform coefficients and the DC coefficient Coef (i,0) of the i-th set of subsequent transform coefficients from the local memory, and computes the attenuation coefficient δ using the DC coefficient Coef(i,0) and the DC coefficient Coef (i,0) according to the Equation Eq(2), as expressed by follows:

$$\delta = Coef'(i, 0)/Coef(i, 0) \qquad \text{Eq (2)}$$

Since the DC component has the least distortion after sound propagation, the attenuation coefficient δ generated according to the DC coefficient Coef (i,0) is the most accurate.

In Step S606, the processor 124 acquires the m-th AC coefficient Coef(i,m) of the i-th set of initial transform coefficients and the m-th AC coefficient Coef(i,m) of the i-th set of subsequent transform coefficients from the local memory, and generates the i-th estimated bit w'(i) in a set of estimated watermark bits using the embedding coefficient α, the attenuation coefficient δ, the AC coefficient Coef(i,m) and the AC coefficient Coef(i,m) according to Equation Eq(3).

$$w'(i) = (Coef'(i, m) * \alpha)/((\delta * Coef(i, m)) - 1) \qquad \text{Eq (3)}$$

The processor 124 may use one or more AC coefficients to generate the i-th estimated bit w'(i) according to Equation Eq(3). In some embodiments, the processor 124 may use 1 AC coefficient to generate the i-th estimated bit w'(i) according to Equation Eq(3). For example, m is 1, and the processor 124 may use the AC coefficient Coef(i, 1) and the AC coefficient Coef (i, 1) to generate the i-th estimated bit w'(i) according to Equation Eq(3).

In other embodiments, the processor 124 may generate the i-th estimated bit w'(i) from a plurality of AC coefficients according to Equation Eq(3). For example, m is 1 to 3, and the processor 124 may generate 3 initial i-th bits using the AC coefficients Coef(i,1) to Coef(i,3) and the AC coefficients Coef(i, 1) to Coef(i, 3) according to Equation Eq(3), respectively, and generate the i-th estimated bit w'(i) according to the 3 initial i-th bits. For example, the processor 124 may determine the mode, the average or other suitable statistics of the 3 initial i-th bits to generate the i-th estimated bit w'(i).

Then in Step S608, since i=1, then processor 124 determines that i is less than I (1<28), and thus in Step S610, i is set to 2 (=1+1), then the processor 124 repeats the loop of Steps S604 to S610 until i reaches 28, thereby generating 28 estimated bits of the set of estimated watermark bits. In addition, the processor 124 repeats Steps S602 to S610 for the remaining 2nd to Pth audio segments to generate the remaining 14 sets of estimated watermark bits.

In Step S612, the processor 124 compares the 15 sets of estimated watermark bits with 1 set of real watermark bits to determine whether the digital input signal contains a watermark. The set of real watermark bits may be stored in the local memory. The processor 124 may compare the I estimated bits of the set of estimated watermark bits with the I bits of the set of real watermark bits to generate a similarity, so as to generate 15 similarities for the 15 sets of estimated watermark bits in the similar manner, where each similarity may be expressed as a percentage. If at least one of the similarities exceeds a preset ratio, the processor 124 may determine that the digital input signal contains the watermark. If no similarity in the 15 sets of estimated watermark bits exceeds the preset ratio, the processor 124 may determine that the digital input signal does not contain the watermark. For example, the preset ratio may be 70%. If the set of real watermark bits is "0010 0101 0001 1100 0100 0101 1011", the first set of estimated watermark bits is "0 101 01 10 001 1 1100 0 0 00 0 0 01 0 011", the bold numbers representing error bits, and thus, the first set of estimated watermark bits contains 9 error bits, the similarity is 68%, less than the preset ratio (68%<70%). If the second set of estimated watermark bits is "001 1 01 10 00 1 1 1100 0 0 00 0 0 01 0 011", the second set of estimated watermark bits contains 7 error bits, and thus the similarity is 75%, exceeding the preset ratio (75%>70%). Consequently, the processor 124 determines that the digital input signal contains the watermark.

The embodiment provides a watermark-based audio processing method and an audio player to embed a set of watermark bits into the digital voice audio conforming to the service language setting in the device for user confirmation, thereby enhancing system usability.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A watermark-based audio processing method for use in an audio player, the audio player comprising a receiver, an analog-to-digital converter, a processor, a digital-to-analog converter, and a transmitter, the methods comprising:
   the receiver receiving an audio input signal;
   the analog-to-digital converter converting the audio input signal from analog to digital to generate a digital input signal;
   the processor detecting an energy of the digital input signal;
   if the energy exceeds a threshold, the processor determining whether a watermark is included in the digital input signal;
   if no watermark is included in the digital input signal, the processor embedding the watermark into a preset digital audio signal to generate a digital output signal;
   the digital-to-analog converter converting the digital output signal from digital to analog to generate an audio output signal; and
   the transmitter outputting the audio output signal for playback.

2. The method of claim 1, wherein:
   the watermark includes a set of watermark bits, the set of watermark bits includes I bits, I being a positive integer; and
   the processor embedding the watermark into the preset digital audio signal to generate a digital output signal comprises:
      segmenting the preset digital signal into P audio segments, P being a positive integer, and dividing each audio segment into I sets of time-domain samples;
      performing a time-domain to frequency-domain transform on the I set of time-domain samples to generate I sets of initial transform coefficients, each set of initial transform coefficients comprising a DC coefficient and N AC coefficients, N being a positive integer;
      updating an m-th AC coefficient of an i-th set of initial transform coefficients according to an embedding coefficient and an i-th bit in the set of watermark bits to generate an i-th set of updated transform coefficients, i being a positive integer less than or equal to I, m being a positive integer less than or equal to N; and
      performing a frequency-domain to time-domain transform according to P*I sets of updated transform coefficients to generate the digital output signal.

3. The method of claim 2, wherein m=1, and the m-th initial AC coefficient is a fundamental frequency coefficient.

4. The method of claim 2, wherein the processor determining whether the watermark is included in the digital input signal comprises:
   segmenting the digital input signal into P audio segments, P being a positive integer, and dividing each audio segment into I sets of time-domain samples;
   performing a time-domain to frequency-domain transform on the I set of time-domain samples to generate I sets of subsequent transform coefficients, each set of subsequent transform coefficients comprising a DC coefficient and N AC coefficients, N being a positive integer;

estimating an attenuation coefficient according to the DC coefficient of an i-th set of subsequent transform coefficients and the DC coefficient of the i-th set of initial transform coefficients;

generating an i-th estimated bit of a set of estimated watermark bits according to the attenuation coefficient, the embedding coefficient, an m-th AC coefficient of the i-th set of subsequent transform coefficients, and the m-th AC coefficient of the i-th set of initial transform coefficients; and determining whether the digital input signal contains the watermark according to the P set of estimated watermark bits.

5. The method of claim 4, wherein determining whether the digital input signal contains the watermark according to the P set of estimated watermark bits comprises:

respectively comparing I estimated bits of the set of estimated watermark bits and I bits of the set of watermark bits to generate a similarity; and if the similarity exceeds a preset ratio, determining that the digital input signal contains the watermark.

6. The method of claim 4, wherein determining whether the digital input signal contains the watermark according to the P set of estimated watermark bits comprises:

respectively comparing I estimated bits of the set of estimated watermark bits and I bits of the set of watermark bits to generate a similarity; and if none of P similarities of the P sets of estimated watermark bits exceeds a preset ratio, determining that the digital input signal does not contain the watermark.

7. The method of claim 1, wherein the digital input signal comprises a keyword, and the preset digital audio signal corresponds to the keyword.

8. The method of claim 7, further comprising:

if the energy does not exceed the threshold, the processor stopping to execute a function corresponding to the keyword.

9. The method of claim 1, wherein the analog-to-digital converter converting the audio input signal from analog to digital to generate the digital input signal comprises:

the analog-to-digital converter converting the audio input signal from analog to digital to generate a digitized audio input signal; and segmenting the digitized audio input signal to generate the digital input signal.

10. A watermark-based audio player comprising:

a receiver configured to receive an audio input signal;

an analog-to-digital converter coupled to the receiver, and configured to convert the audio input signal from analog to digital to generate a digital input signal;

a processor coupled to the analog-to-digital converter, and configured to detect an energy of the digital input signal, determine whether the digital input signal contains a watermark if the energy exceeds a threshold, and embed the watermark into a preset digital audio signal to generate a digital output signal if no watermark is included in the digital input signal;

a digital-to-analog converter coupled to the processor, and configured to convert the digital output signal from digital to analog to generate an audio output signal; and a transmitter coupled to the digital-to-analog converter, and configured to output the audio output signal for playback.

11. The audio player of claim 10, wherein the watermark comprises a set of watermark bits, the set of watermark bits comprises I bits, I being a positive integer; and the processor is configured to:

segment the preset digital signal into P audio segments, and divide each audio segment into I sets of time-domain samples, P being a positive integer;

perform a time-domain to frequency-domain transform on the I set of time-domain samples to generate I sets of initial transform coefficients, each set of initial transform coefficients comprising a DC coefficient and N AC coefficients, N being a positive integer;

update an m-th AC coefficient of an i-th set of initial transform coefficients according to an embedding coefficient and an i-th bit in the set of watermark bits to generate an i-th set of updated transform coefficients, i being a positive integer less than or equal to I, m being a positive integer less than or equal to N; and perform a frequency-domain to time-domain transform according to P*I sets of updated transform coefficients to generate the digital output signal.

12. The audio player of claim 11, wherein m=1, and the m-th initial AC coefficient is a fundamental frequency coefficient.

13. The audio player of claim 11, wherein the processor is configured to:

segment the digital input signal into P audio segments, and divide each audio segment into I sets of time-domain samples, P being a positive integer;

perform a time-domain to frequency-domain transform on the I set of time-domain samples to generate I sets of subsequent transform coefficients, each set of subsequent transform coefficients comprising a DC coefficient and N AC coefficients, N being a positive integer;

estimate an attenuation coefficient according to the DC coefficient of an i-th set of subsequent transform coefficients and the DC coefficient of the i-th set of initial transform coefficients;

generate an i-th estimated bit of a set of estimated watermark bits according to the attenuation coefficient, the embedding coefficient, an m-th AC coefficient of the i-th set of subsequent transform coefficients, and the m-th AC coefficient of the i-th set of initial transform coefficients; and determine whether the digital input signal contains the watermark according to the P set of estimated watermark bits.

14. The audio player of claim 13, wherein the processor is configured to:

respectively compare I estimated bits of the set of estimated watermark bits and I bits of the set of watermark bits to generate a similarity; and if the similarity exceeds a preset ratio, determine that the digital input signal contains the watermark.

15. The audio player of claim 13, wherein the processor is configured to:

respectively compare I estimated bits of the set of estimated watermark bits and I bits of the set of watermark bits to generate a similarity; and if none of P similarities of the P sets of estimated watermark bits exceeds a preset ratio, determine that the digital input signal does not contain the watermark.

16. The audio player of claim 10, wherein the digital input signal includes a keyword, and the preset digital audio signal corresponds to the keyword.

17. The audio player of claim 16, wherein the processor is further configured to:

stop to execute a function corresponding to the keyword if the energy does not exceed the threshold.

18. The audio player of claim 10, wherein:

the analog-to-digital converter is further configured to convert the audio input signal from analog to digital to generate a digitized audio input signal; and the processor is further configured to segment the digitized audio input signal to generate the digital input signal.

* * * * *